United States Patent
Khuri-Yakub et al.

(10) Patent No.: US 6,853,041 B2
(45) Date of Patent: Feb. 8, 2005

(54) MICRO-MACHINED COUPLED CAPACITOR DEVICES

(75) Inventors: Butrus Thomas Khuri-Yakub, Palo Alto, CA (US); Fahrettin Levent Degertekin, Atlanta, GA (US); Arif Sanli Ergun, Mountain View, CA (US)

(73) Assignee: The Board of Trustees of the Leland Stanford Junior University, Stanford, CA (US)

( * ) Notice: Subject to any disclaimer, the term of this patent is extended or adjusted under 35 U.S.C. 154(b) by 140 days.

(21) Appl. No.: 09/896,900

(22) Filed: Jun. 28, 2001

(65) Prior Publication Data

US 2002/0075098 A1 Jun. 20, 2002

Related U.S. Application Data

(60) Provisional application No. 60/214,834, filed on Jun. 28, 2000.

(51) Int. Cl.[7] .............................................. H01L 29/82
(52) U.S. Cl. ....................... 257/415; 362/259; 362/285; 362/286; 362/287; 362/418; 362/427
(58) Field of Search ................................ 362/257, 285, 362/286, 287, 418, 427

(56) References Cited

U.S. PATENT DOCUMENTS 6,257,739 B1 * 7/2001 Sun et al. ................... 362/285

* cited by examiner

*Primary Examiner*—David Nelms
*Assistant Examiner*—Tran Mai-Huong
(74) *Attorney, Agent, or Firm*—Lumen Intellectual Property Services, Inc.

(57) ABSTRACT

The present invention provides an apparatus and method for a new class of micro-machined electromechanical devices that make use of vibrating membranes. The electromechanical devices include two or more electrodes which are positioned with a membrane. A gap exists between the membrane and each electrode which may vary for each electrode. In general, one electrode is used as an input electrode which receives an electrical signal that causes vibration of the membrane. The vibration of the membrane is then coupled to a receiving or an output electrode. A DC bias voltage is applied to the electrodes to set or modify a width of a gap in the electromechanical device. The electromechanical device could be designed as a transformer, a capacitor, a resonator or a filter. In addition, the device includes a control voltage to dynamically change the coupling between the input electrode and the output electrode(s).

15 Claims, 2 Drawing Sheets

_US 6,853,041 B2_

MICRO-MACHINED COUPLED CAPACITOR DEVICES

CROSS-REFERENCE TO RELATED APPLICATIONS

This application is cross-referenced to and claims priority from U.S. Provisional Application No. 60/214,834 filed Jun. 28, 2000, which is hereby incorporated by reference.

FIELD OF INVENTION

This invention relates generally to electromechanical devices. More particularly, it relates to a new class of coupled capacitor devices as transformers and filters.

BACKGROUND

Electromechanical devices can be integrated in electronic circuits. The prior art describes a large number of such devices that are used as tools by electrical engineers to build various types of electronic circuits such as, for instance, RF circuits and RF electronics. These devices can be tailored for different types of applications each with its own specifications. In prior art electromechanical devices, such as piezoelectric devices, piezoelectricity sets in motion solid plates in response to an electrical signal. The mechanical displacement is coupled to another piezoelectric, or the same piezoelectric is coupled with another electrode, to make mechanical devices and filters. The electromechanical devices would have one input and one or more outputs. The device thus made can be a transformer or a filter with different characteristics. The electromechanical devices could also be magnetic devices, instead of piezoelectric devices, wherein a magnetic field sets in motion the solid plates in response to an electrical signal. The present invention provides a new class of electromechanical devices based on micro-machining techniques that competes with their piezoelectric or magnetic equivalents.

SUMMARY OF THE INVENTION

The present invention provides an apparatus and method for a new class of micro-machined electromechanical devices that make use of resonant membranes. The electromechanical device of the present invention includes two or more electrodes which are positioned with a membrane. A gap exists between the membrane and each electrode which may vary for each electrode. In general, one electrode is used as an input electrode which receives an electrical signal that causes vibration of the membrane. The vibration of the membrane is then coupled to a receiving or an output electrode. The present invention also includes one or more output electrodes. The membrane is a vibrating coupling membrane which is preferably made out of, but not limited to, silicon nitride. A DC bias voltage is applied to the electrodes to set or modify a width of a gap in the electromechanical device. The electromechanical device of the present invention could be designed as a transformer, a capacitor, a resonator or a filter. In addition, the present invention includes a control voltage to dynamically change the coupling between the input electrode and the output electrode(s). In exemplary embodiments, the present invention is shown with two electrodes of rectangular shapes either side by side or opposite from each other. The present invention is not limited to the number of electrodes, shape of electrodes, or position of the electrodes with respect to the membrane. In addition, the membrane could have different sizes and shapes depending on the application. The present invention also includes an apparatus and method for an electronic system that integrates an electronic circuit, having one or more standard electronic components, with one or more membrane coupled micro-machined electromechanical devices.

In view of that which is stated above, it is the objective of the present invention to provide a new class of electromechanical devices that make use of resonant membranes which are made by micro-machining.

It is another objective of the present invention to provide a device with two or more electrodes positioned to a vibrating membrane.

It is yet another objective of the present invention to provide a device with a DC bias voltage applied to each electrode that is used to set or modify the width of the gap in each capacitor, which in turn determines the position of the membrane.

It is still another objective of the present invention to provide an electromechanical device with a control voltage to dynamically change the coupling between an input electrode and output electrode(s).

An advantage of the present invention over the prior art is that the present invention enables one skilled in the art to make a new class of micro-machined electromechanical devices that are based on membrane coupling and integrate these devices in electronics making electronic circuits.

BRIEF DESCRIPTION OF THE FIGURES

The objectives and advantages of the present invention will be understood by reading the following detailed description in conjunction with the drawings, in which.

DETAILED DESCRIPTION OF THE INVENTION

Although the following detailed description contains many specifics for the purposes of illustration, anyone of ordinary skill in the art will readily appreciate that many variations and alterations to the following exemplary details are within the scope of the invention.

The present invention provides a new class of electromechanical devices that make use of resonant thin membranes. More specifically, the present invention uses a set of membrane-coupled capacitors as, for instance, but not limited to, a transformer, resonator and a filter. In a coupled capacitor device of the present invention, a membrane positioned between two electrodes constitutes two coupled capacitors in series. In general, two or more electrodes could be used and coupled to the membrane. A gap exists between each electrode and the membrane. Gaps can have different sizes and are usually in the order of $\mu$m. The electrodes are made out of any type of conductive material, such as, but not limited to, a metal material. Most of the time, one electrode is used as the input, while the other electrode serves as the output. The present invention also includes having multiple electrodes as output. A DC bias voltage applied to each electrode is used to set or modify the width of the gap in each capacitor, which in turn determines the position of the membrane. When set into motion, the membrane couples the output, or outputs, to the input, hence the coupled capacitors act as a transformer. The ratio of the AC output to the input voltages, which is a measure of the transformation ratio of the transformer, is proportional to the DC bias voltages, the widths of the gaps, and the areas of the capacitors. Since this ratio can be controlled by the application of the DC bias voltages, the transformer can be made to be adaptable to the variations in the impedances of the load and the source it couples, which are to be matched.

The output to input relationship can be tailored according to the shape of the membrane and frequency of operation thus making filters with different characteristics. For instance, filters with different filtering characteristics can be made depending on the frequency of operation, that is to say depending on the mode of vibration of the membrane. Transformers with multiple output taps can be made by placing several electrodes on the membrane and delivering different outputs at different frequencies to the various electrodes depending on the resonant modes of operation.

Figure 1:
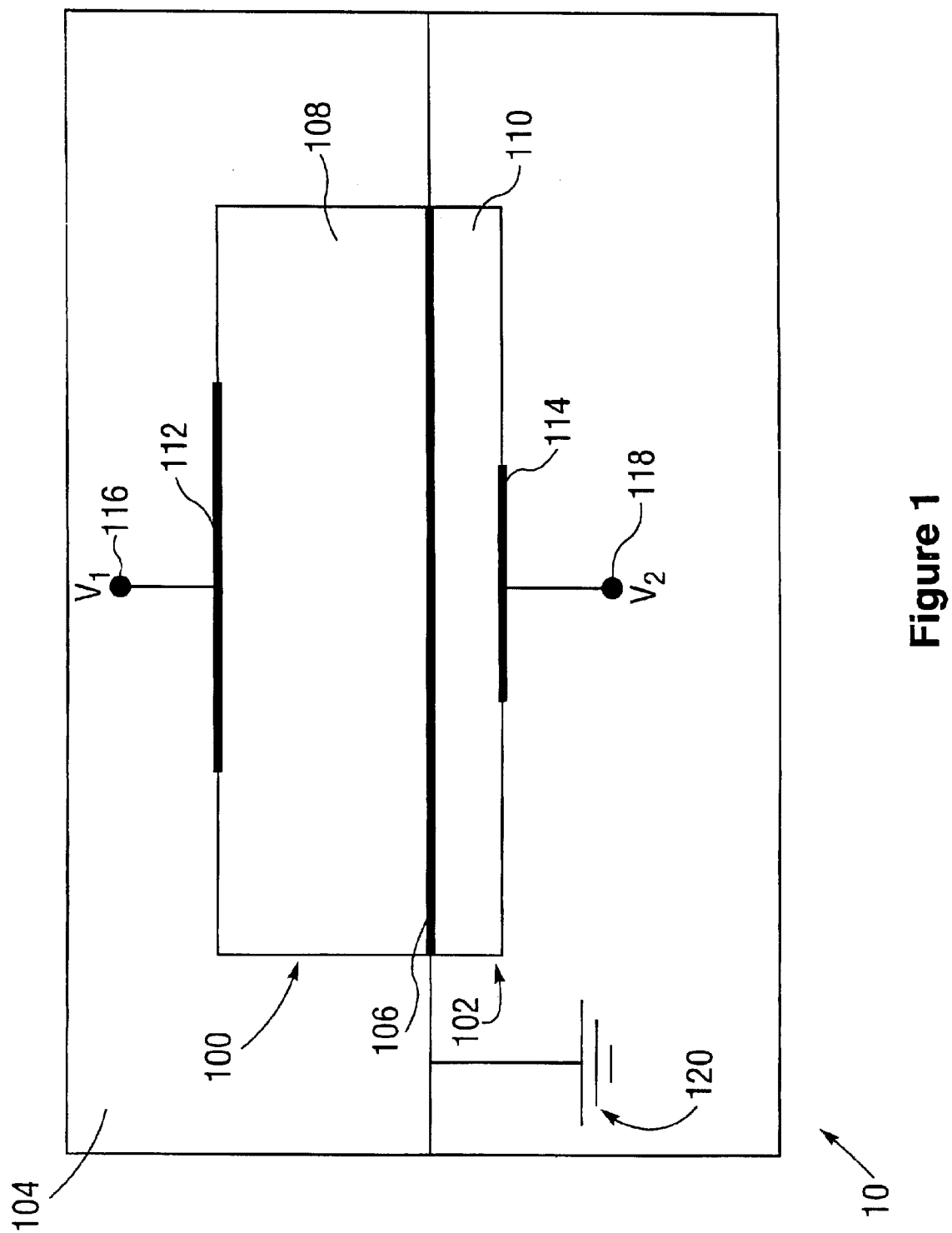
FIG. 1 illustrates a transformer configuration using two back to back micro-machined capacitors that share a single vibrating membrane for making a transformer whose transformer ratio can be tuned continuously over a broad range.

In an exemplary embodiment of the present invention, two capacitors 100 and 102 are made side-by-side on a substrate 104 as shown in FIG. 1. FIG. 1 shows an exemplary transformer configuration 10 using two back to back micro-machined capacitors that share a single vibrating coupling membrane 106. The gaps 108 and 110 of the capacitors 100 and 102 can be set by the micro-machining or other manufacturing process, and the areas of the metal electrodes 112 and 114 in the capacitors can also be varied. The location of the output electrode 112 can be chosen based upon the nature of an application, and there can be more than one output electrode. The vibrating coupling membrane 106 itself can be made of any material such as silicon carbide, diamond, silicon, glass and the like, though silicon nitride is a preferred choice. Also the vibrating coupling membrane can be mechanically connected to the substrate in different ways to adjust its resonant mode shapes and to minimize the energy losses to the substrate structure. Also to eliminate losses to the surrounding medium, the electromechanical device can be placed in a vacuum-sealed cavity. When operating at or below the lowest order resonance, membrane 106 couples output 114 to input 112 in the same fashion as described above. At higher frequencies, membrane 106 can be resonant at some modes in which the displacements of metal electrodes 112 and 114 are out of phase with each other, thus altering the input to output relationships of the transformer. The shape of the capacitors can be of any geometry, and the metal electrodes (one input and one or more outputs) can be of varying shapes (circular, square, rectangular or combinations of the like) to take the advantage of certain resonance modes of membrane 106 in a particular application. Hence, the corresponding transformer is made to operate at certain frequencies with predictable gain.

An input signal called $V_1$ 116 sets membrane 106 in vibration in the same fashion used to excite cMUTs as transmitters of sound. Membrane 106 is attached to electrical ground 120 as shown in FIG. 1. Capacitor $C_2$ 102 shares membrane 106 with capacitor $C_1$ 100. Capacitor $C_2$ 102 also has a DC bias voltage across its electrodes. Thus the vibration of membrane 106 will induce an AC voltage across its electrodes 112 and 114 in the same fashion a receiver cMUT generates a voltage in response to an incident sound wave. The difference between the configuration of FIG. 1 and a separate transmitter and receiver pair is that the two capacitors 100 and 102 used as in the present invention share the same membrane 106. The DC position of membrane 106 depends on the two DC biases applied to the two capacitors 100 and 102. Thus, the position of membrane 106 is determined by the DC bias of the two capacitors 100 and 102, and thus the heights of the gaps 108 and 110 in the two capacitors 100 and 102 are determined by the DC bias on the two capacitors. In the exemplary embodiment of FIG. 1, the ratio of the AC output to input voltages 116 and 118, which is a measure of the transformer transformation ratio, is proportional to the DC voltages, the gap heights, and the areas of the two capacitors. This ratio can be altered with the application of DC bias and thus the transformer can be made to adapt to variations in the impedance of a load and source that are to be matched.

When a coupling device of the present invention operates around the resonant frequencies, its input to output characteristics also constitute a filter, or an amplifying filter in some cases. The location and shape of the electrodes can be so chosen to tailor the filtering characteristics to a particular application.

The capacitor coupling devices described in the present invention can be readily integrated with various electronics. Given that the characteristics of a coupling device can be altered by the application of DC bias voltages, the corresponding transformer ratio or the filter response can be adjusted to adapt the variations in an electronic circuit (due to aging, for instance), thus making the performance of the circuit stable and reliable.

Moreover, a control voltage can be used to dynamically change the coupling between the input and the output of the transformer. For instance, if the membrane has a high mechanical Q, using a small control voltage can effectively modulate the amplitude of the output signal.

Figure 2:
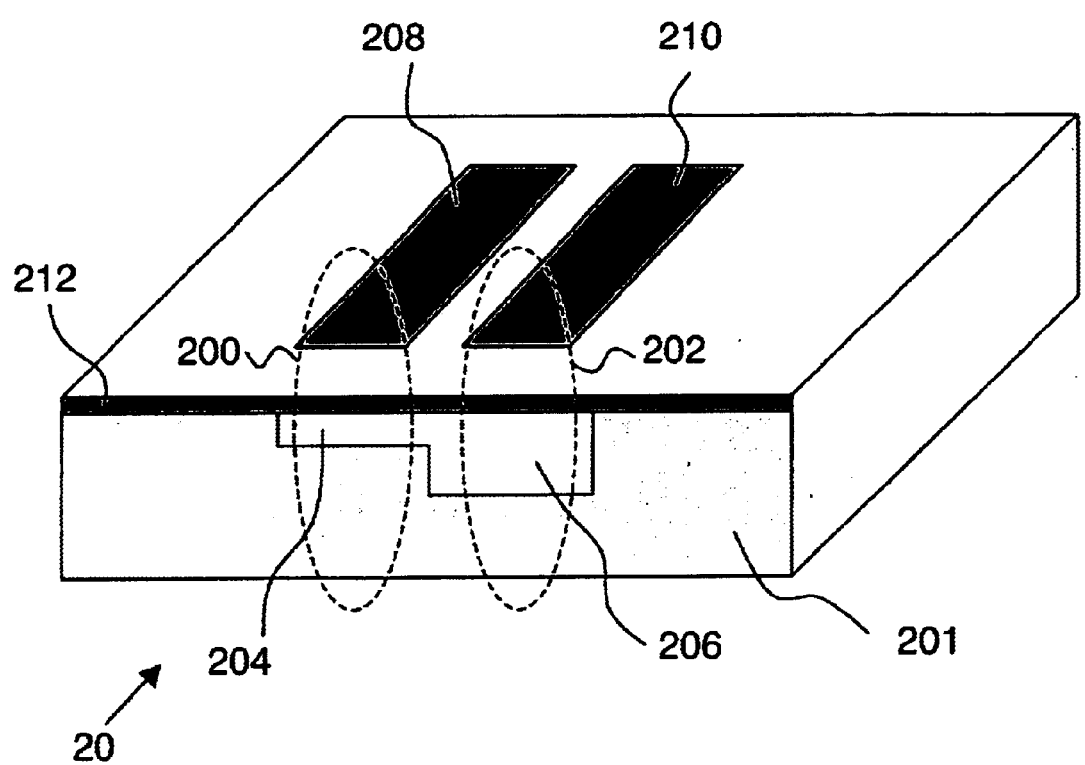
FIG. 2 illustrates a schematic diagram of a type of coupled capacitors device.

FIG. 2 shows another configuration 20 of a set of coupled capacitors 200 and 202 that can be used as a transformer or filter. Here, the two capacitors 200 and 202 are made side by side on the same substrate 201. The gaps 204 and 206 of the capacitors 200 and 202 can be made different via the micro-machining or any other type of manufacturing process. The metal electrodes 208 and 210 of each capacitor can also be made of different sizes or areas. The location of the second electrode can be chosen based on the application, and certainly more than one output metal electrode can be made. Membrane 212 itself can be made of any number of materials though the material of choice is silicon nitride. As shown in FIG. 2, one electrode is used as an input while the other is used for an output. The present invention is not limited to the number or shape of electrodes. For instance, multiple output electrodes can be used. The DC bias applied to each is used to set the gap height. There is coupling between the two DC biases, and one should control the values of both DC biases in order to obtain the desired gap heights. When operating at or below the lowest order resonance, membrane 212 is set into motion and the output is coupled to the input in the same fashion as explained earlier with respect to FIG. 1. At higher frequencies, membrane 212 can be resonant around some modes where the displacements at each metal electrode are out of phase with respect to each other thus altering the input to output relationships of the transformer.

The metal lines of electrodes 208 and 210 in FIG. 2 are shown to be rectangular. The shape of the capacitors can be of any geometry, and metal electrodes 208 and 210 (one input and one or many outputs) can be of varying shapes to take advantage of certain modes of resonance of the particular membrane 212 in question. Thus, a transformer is made to operate at certain frequencies with some predetermined gain.

The input to output relationships, especially when the device is considered around the resonant frequencies of membrane 212, can be thought of as a filter. Alternately, the device can be thought of as an amplifying filter around the resonance frequencies. The location and shape of the metal electrodes can then be chosen to tailor the filter characteristics to fit a certain design or application.

The family of devices proposed here can be integrated with electronics, thus making part of the electronic circuit. In short, the family of devices proposed increase the family of electronic devices available to circuit designers of RF circuits and RF electronics. Furthermore, the character of these devices can be changed by the application of DC bias. Thus, the transformer ratio or the filter response can he altered to fit variation in a circuit, such as due to aging, and force the response of the circuit to be stable and the same over long periods of time.

The present invention has now been described in accordance with several exemplary embodiments, which are intended to be illustrative in all aspects, rather than restrictive. Thus, the present invention is capable of many variations in detailed implementation, which may be derived from the description contained herein by a person of ordinary skill in the art. All such variations are considered to be within the scope and spirit of the present invention as defined by the following claims and their legal equivalents.

What is claimed is:

1. An electromechanical device, comprising:
   (a) two or more electrodes comprising an input electrode and at least one output electrode;
   (b) a membrane positioned with said two or more electrodes, wherein said input electrode receives an electrical signal that causes vibration of said membrane and said vibration is coupled to said at least one output electrode, whereby coupling between said input electrode and said at least one output electrode is provided; and
   (c) a ground referenced to said input electrode and said output electrode;
   wherein a voltage is applied to said electromechanical device to vary said coupling.

2. The electromechanical device as set forth in claim 1, wherein said membrane is positioned at a distance from said two or more electrodes.

3. The electromechanical device as set forth in claim 1, wherein said two or more electrodes are positioned at various distances from said membrane.

4. The electromechanical device as set forth in claim 1, wherein said membrane is a vibrating coupling membrane.

5. The electromechanical device as set forth in claim 1, wherein said voltage is a DC bias voltage applied to said two or more electrodes to set or modify a width of a gap in said electromechanical device.

6. The electromechanical device as set forth in claim 1, wherein said electromechanical device is a transformer.

7. The electromechanical device as set forth in claim 1, wherein said electromechanical device is a capacitor.

8. The electromechanical device as set forth in claim 1, wherein said electromechanical device is a resonator.

9. The electromechanical device as set forth in claim 1, wherein said electromechanical device is a filter.

10. The electromechanical device as set forth in claim 9, wherein said filter operates around a resonant frequency.

11. The electromechanical device as set forth in claim 1, wherein said voltage is a control voltage to dynamically change said coupling between said input electrode and said output electrodes.

12. The electromechanical device as set forth in claim 1, wherein said two or more electrodes are positioned side by side on said membrane.

13. The electromechanical device as set forth in claim 1, wherein said membrane is selected from the group consisting of silicon nitride, silicon carbide, diamond, silicon and glass.

14. The electromechanical device as set forth in claim 1, wherein said membrane has varying shapes.

15. The electromechanical device as set forth in claim 1, wherein said two or more electrodes have varying shapes.

* * * * *

UNITED STATES PATENT AND TRADEMARK OFFICE
CERTIFICATE OF CORRECTION

PATENT NO. : 6,853,041 B2
DATED : February 8, 2005
INVENTOR(S) : Khuri-Yakub et al.

It is certified that error appears in the above-identified patent and that said Letters Patent is hereby corrected as shown below:

Title page,
Item [75], Inventors, "Butrus Thomas Khuri-Yakub, Palo Alto, VA (US); Fahrettin Levent Degertekin, Atlanta, GA (US); Arif Sanli Ergun, Mountain View, CA (US)" should read -- Butrus Thomas Khuri-Yakub, Palo Alto, CA (US); Fahrettin Levent Degertekin, Atlanta, GA (US); Arif Sanli Ergun, Mountain View, CA (US); Mohammed H. Badi, Stanford, CA (US) --.

Signed and Sealed this

Twenty-sixth Day of April, 2005

JON W. DUDAS
*Director of the United States Patent and Trademark Office*